Figure 1:
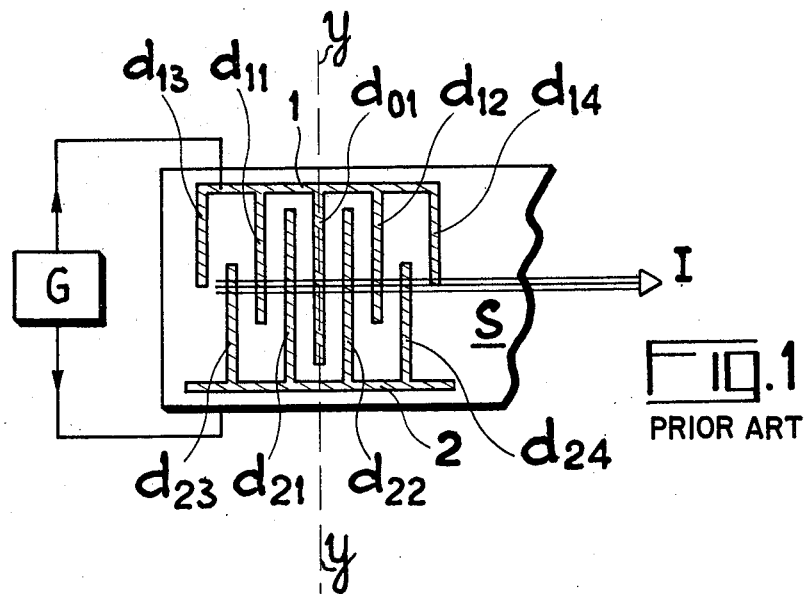

United States Patent [19]
Coussot et al.

[11] 4,096,456
[45] Jun. 20, 1978

[54] SURFACE ELASTIC WAVE FILTER

[75] Inventors: Gérard Coussot; Olivier Menager, both of Paris, France

[73] Assignee: Thomson-CSF, Paris, France

[21] Appl. No.: 753,351

[22] Filed: Dec. 21, 1976

Related U.S. Application Data

[63] Continuation of Ser. No. 597,574, Jul. 21, 1975, abandoned.

[30] Foreign Application Priority Data

Jul. 24, 1974 France .................................. 74 25663

[51] Int. Cl.² ........................ H03H 9/04; H03H 9/26; H03H 9/32; H01L 41/10
[52] U.S. Cl. ...................................... 333/72; 310/313; 333/30 R
[58] Field of Search ........................ 333/71, 72, 30 R; 310/8, 8.2, 9.8, 313

[56] References Cited

U.S. PATENT DOCUMENTS

| | | | |
|---|---|---|---|
| 3,582,838 | 6/1971 | DeVries | 333/72 |
| 3,675,163 | 7/1972 | Hartmann et al. | 333/30 R |
| 4,007,433 | 2/1977 | Houkawa et al. | 333/72 |

Primary Examiner—Alfred E. Smith
Assistant Examiner—Marvin Nussbaum
Attorney, Agent, or Firm—Cushman, Darby & Cushman

[57] ABSTRACT

A surface elastic wave filter in which Rayleigh waves experience only small attenuation and phase-shift, the number of radiating elements encountered by the surface wave during the wave propagation having a direction parallel to an axis xx through the filter, being restricted. The filter comprises at least one electromechanical transducer constituted by two metallic comb structures A and B whose teeth $d_{A1}$, $d_{A2}$, $d_{A3}$ and $d_{B1}$, $d_{B2}$, $d_{B3}$ are interdigitated and are arranged at either side of an axis yy in symmetrical fashion vis-a-vis a point M located upon said axis, at the center of the transducer. The filter can be used to the filtering of video-frequency signals in television circuits.

5 Claims, 8 Drawing Figures

SURFACE ELASTIC WAVE FILTER

This is a continuation of application Ser. No. 597,574 filed July 21, 1975, now abandoned.

The present invention relates to surface wave filters, these filters being constituted by a substrate upon which there are arranged two electromechanical transducers making it possible to emit and receive surface elastic waves known as Rayleigh waves.

The transfer function of a surface wave filter is equal to the product of the transfer functions of each of the transducers, multipled by a term $e^{j2\pi f\tau}$, where $f$ is the frequency and $\tau$ the propagation delay along the acoustic line formed by the substrate.

To obtain the requisite transfer function, which takes the form:

$$H(f) = \int_{-\infty}^{+\infty} R(t)e^{-j2\pi f t}d\tau$$

the pulse response $R(t)$ which it is desired to achieve is determined, this pulse response $R(t)$ being associated with the structure of the transducers which are used, the latter generally being constituted by two interdigital comb structures.

In fact, the mechanical wave propagating through the substrate corresponds to a pulse response $R(t)$ formed by a succession of pulses whose amplitude is proportional to the length of overlap between the teeth of the two comb structures forming the transducer, the time-based distribution of these pulses depending upon the interval separating two consecutive pairs of teeth.

The pulse response:

$$R(t) = \int_{-\infty}^{+\infty} H(f)e^{j2\pi f\tau} df$$

is a real function of time, generally taking the form $e(t)$ sin $\phi$ $(t)$ and corresponds to an imaginary transfer function $H(f)$ obtained from a structure having an axis of symmetry perpendicular to the direction of propagation of the surface wave.

The drawback of symmetrical structures of this kind is that they introduce substantial attenuation and phase-shift in the surface wave propagating through the substrate, this surface wave being intercepted during propagation, by many radiating elements constituted by the overlapping parts of two associated teeth.

Surface wave filters in accordance with the invention utilise transducers along which the surface wave can propagate with low attenuation and small phase-shift.

In accordance with the invention, a surface elastic wave filter comprising a piezo-electric substrate upon the surface of which there are arranged at least one input transducer and one output transducer, one of said transducers at least being constituted by two metal electrodes taking the form of two interdigitated comb structures having parallel teeth of predetermined lengths, two consecutive teeth, belonging respectively to one and the other comb, overlapping over a given length, for obtaining an overlapping portion defining a radiating element; said two interdigitated comb structures determining a central radiating element and a set of non-central radiating elements which are located at either side of said central radiating element; said radiating elements having predetermined lengths; each of said noncentral radiating elements located at either side of the central radiating element, said centre of symmetry M being located upon an axis xx which is the propagation axis of said elastic waves.

Figure 2:
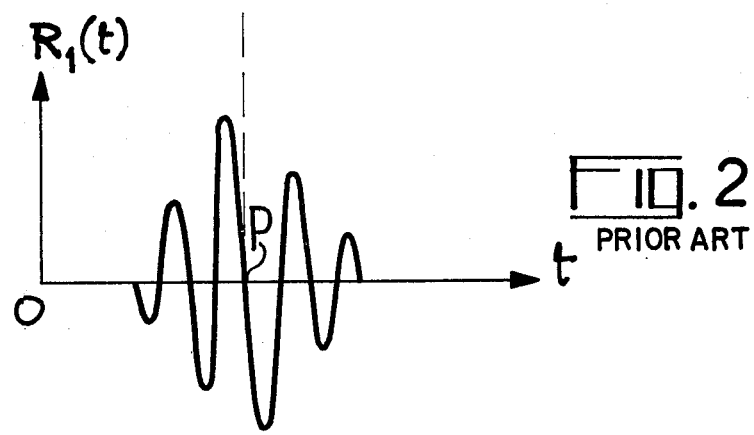
Figure 3:
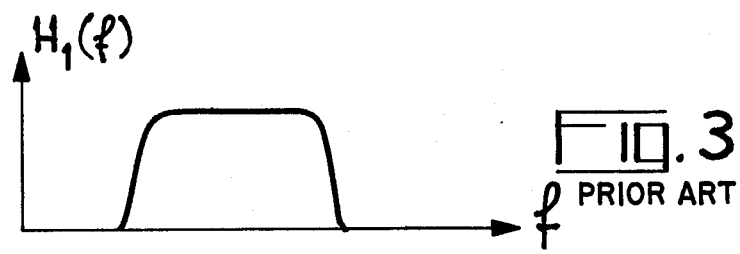
Figure 4:
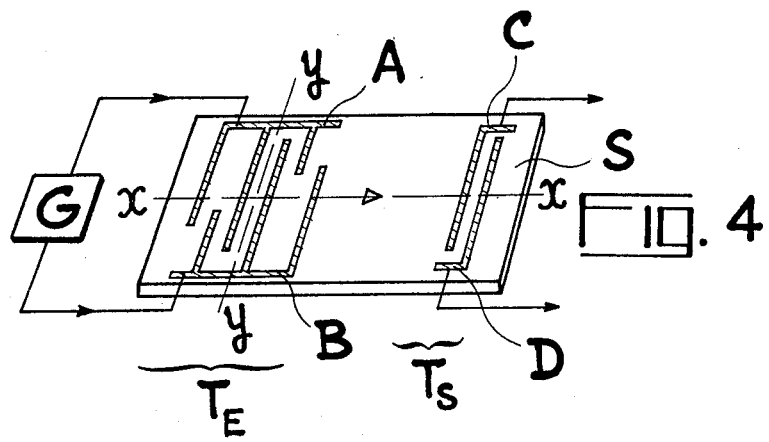
Figure 5:
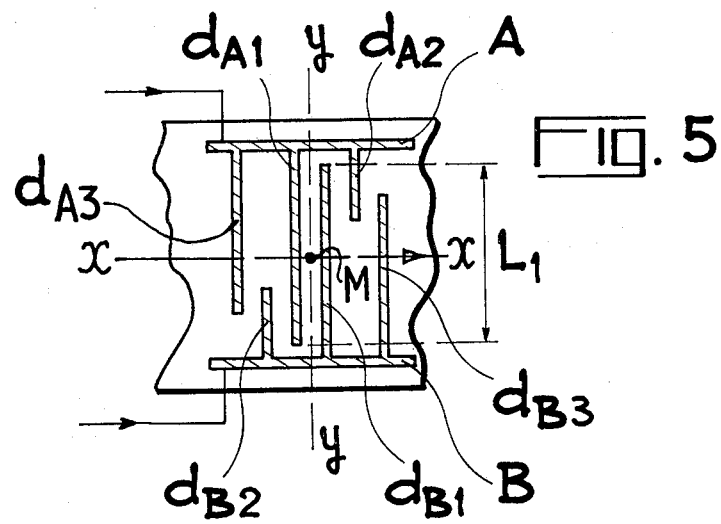
Figure 6:
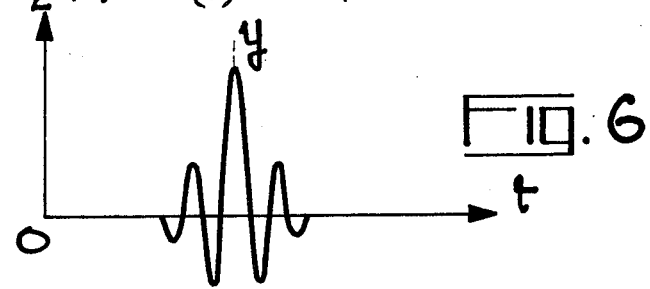
Figure 7:
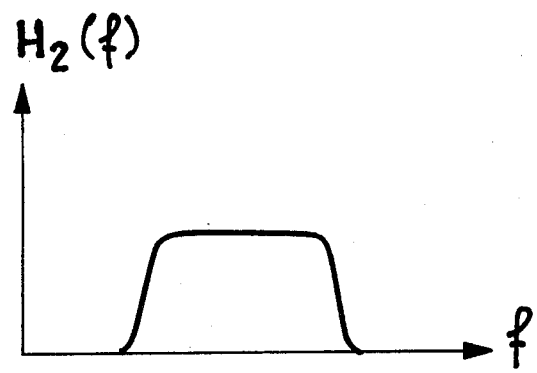
Figure 8:
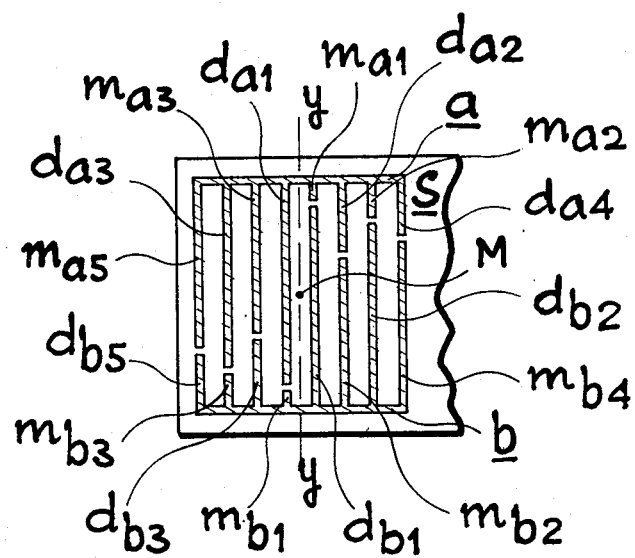

For the better understanding of the invention and to show how the same may be carried into effect, reference will be made to the drawings accompanying the ensuing description in which:

FIGS. 1, 2 and 3 respectively illustrate a filter having an input transducer with a known symmetrical structure, the corresponding pulse response $R_1(t)$ and the associated transfer function $H_1(f)$;

FIGS. 4 and 5 illustrate a filter with a transducer which has a structure in accordance with the invention;

FIGS. 6 and 7 respectively illustrate the pulse response $R_2(t)$ corresponding to a structure in accordance with the invention, and the associated transfer function $H_2(f)$;

FIG. 8 illustrates another example of a transducer having a structure in accordance with the invention.

A surface elastic wave filter generally comprises, as FIG. 1 shows, a piezo-electric substrate S upon which there are arranged a first pair of comb structures 1 and 2 constituting an input transducer, and a second pair of comb structures (not shown in FIG. 1) constituting an output transducer.

These comb structures 1 and 2 respectively comprise teeth $d_{01}, d_{11}, d_{12}, d_{13}, d_{14}$ and $d_{21}, d_{22}, d_{23}, d_{24}$ of interdigitated design, the teeth $d_{11}, d_{12} \ldots$ of the comb 1 being disposed symmetrically to either side of the central tooth $d_{01}$ which is located on the axis of symmetry yy of the structure.

The comb structures 1 and 2 of the transducer are designed to be supplied with a signal furnished for example by a generator G.

A transducer having this kind of symmetrical structure furnishes a pulse response $R_1(t)$ as shown in FIG. 2, and a corresponding transfer function $H_1(t)$ (FIG. 3), which is the Fourier transform of $R_1(t)$. In the case of a symmetrical structure, the transducer produces a pulse response $R_1(t)$ of the form $e(t)$ sin $\phi$ $(t)$ where $\phi$ $(-t) = -\phi$ $(t)$.

However, a surface wave passing through a transducer of this type is highly attenuated and undergoes major phase shift, because the radiating elements which it encounters and which are formed by the overlapping parts of the teeth. The structure in accordance with the invention as shown in FIG. 4, overcomes this drawback.

It comprises a piezo-electric substrate S of quartz or lithium niobate for example, upon which there are arranged an input transducer $T_E$ and an output transducer $T_S$ respectively constituted by two interdigitated comb structures A, B and C, D.

FIG. 5 illustrates in detail the structure of a transducer in accordance with the invention corresponding to the input transducer $T_E$ of the filter shown in FIG. 4. The interdigitated comb structures A and B of this transducer $T_E$ respectively comprise $n$ teeth ($n = 3$), $d_{A1}, d_{A2}, d_{A3}$, and $d_{B1}, d_{B2}, d_{B3}$, arranged in such a fashion that the teeth $d_{A1}$ and $d_{B1}$ which have identical dimensions and overlap each other over a predetermined length delimiting an interval or "overlaping portion" defining a central or radiating element located at the centre of the transducer $T_E$. The teeth $d_{A2}$ and $d_{B2}$ located at either side of the central radiating element and the teeth $d_{A3}$ and $d_{B3}$ located at either side of the central radiating element, are symmetrical in relation to a point M and only in relation to this point M which is located upon the axis yy, at the centre of the transducer $T_E$. Thus, the non central radiating elements of the transducer $T_E$ respectively formed by the overlapping portions of teeth $d_{B1}$, $d_{A2}$; $d_{A2}$, $d_{B3}$; $d_{A1}$, $d_{B2}$; $d_{B2}$, $d_{A3}$ are symmetrical in pairs in relation to the center of symmetry M and asymmetrical by respect with axis yy and so axis xx which is the propagation axis of the structure. The pulse response $R_2(t)$ exhibits symmetry in relation to the axis yy. It is a real function of time and takes the form $e(t) \cos\phi(t)$.

The corresponding real transfer function $H_2(t)$ (FIG. 7) is identical to the pure, imaginary transfer function $H_1(f)$ obtained with a transducer of symmetrical structure, with the exception of a phase-shift $\pi/2$.

The advantage of a transducer having such a structure in accordance with the invention is that it makes it possible for the surface wave created by this transducer to propagate without substantial amplitude and phase disturbance, the number of radiating elements encountered by the surface wave during propagation along the axis xx, being very much less, in this case, than the number of radiating elements which it would encounter in a known symmetrical structure.

FIG. 8 illustrates another embodiment of a transducer of a structure in accordance with the invention.

This transducer is produced by photogravure operations performed upon a metal deposit, for example aluminum, formed on a substrate S of lithium niobate.

The transducer shown in FIG. 8 comprises two interdigitated comb structures a and b respectively formed by a succession of so-called "active" and "inactive" teeth. The active teeth $d_{a1}$, $d_{a2}$, $d_{a3}$, $d_{a4}$ of the comb structure a are located opposite the inactive teeth $m_{b1}$, $m_{b2}$, $m_{b4}$, $m_{b5}$ of the comb structure b, and the active teeth $d_{b1}$, $d_{a2}$, $d_{b3}$, $d_{b5}$ are located opposite the inactive teeth $m_{a1}$, $m_{a2}$, $m_{a3}$, $m_{a5}$ of the comb structure a. It is exclusively the pairs of active teeth $d_{a1}$, $d_{b1}$; $d_{b1}$ $d_{a2}$; $d_{a2}$, $d_{b2}$; $d_{b2}$, $d_{a4}$; $d_{a1}$, $d_{b3}$; $d_{b3}$, $d_{a3}$; $d_{a3}$, $d_{b5}$, which form the radiating elements of the transducer the pair of active teeth $d_{a1}$, $d_{b1}$ forming the central radiating element of the transducer and the other pairs forming the non-central radiating elements which are symmetrical two by two relatively to the centre of symmetry M of and only to this centre of symmetry M, these elements being symmetrical in pairs relatively to the central point M of and only to this central point M of the structure and disposed in an asymmetrical fashion by respect with axis xx and yy. The surface wave propagating in the structure corresponding to this embodiment, as in the embodiment in accordance with the invention as described earlier, encounters a restricted number of radiating elements which could disturb it.

What is claimed is:

1. A surface elastic wave filter comprising a piezoelectric substrate upon the surface of which there are arranged at least one input transducer and one output transducer, one of said transducers at least being constituted by two metal electrodes taking the form of two interdigitated comb structures having parallel teeth of predetermined lengths, two consecutive teeth, belonging respectively to one and the other comb, overlapping over a given length for obtaining an overlapping portion defining a radiation element; said two interdigitated comb structures determining a central radiating element and a set of non-central radiating elements which are located at either side of said central radiating element; said radiating elements having predetermined lengths; each of said non-central radiating elements which is located on one side of said central radiating element being symmetrical, in relation to a centre of symmetry M situated at the centre of said central radiating element, with one of said non central radiating elements located on the other side of said central radiating element, said centre of symmetry M being located upon an axis xx which is the propagation axis of said elastic wave.

2. A surface elastic wave filter as claimed in claim 1, wherein said transducers are produced by photogravure operations performed upon a metal film deposited upon the substrate.

3. A surface elastic wave filter as claimed in claim 2, wherein said substrate is made of lithium niobate.

4. A surface elastic wave filter as claimed in claim 2, wherein said metal film is aluminium.

5. A surface elastic wave filter as claimed in claim 1, wherein each of the comb structures comprises so-called "active" and so-called "inactive" teeth disposed in alternating succession to one another, only the "active" teeth of each of the comb structures overlapping to form said central radiating element and said set of non-central radiating elements which are located at either side of said central radiating element and disposed symmetrically in pairs in relation to said centre of symmetry M.

* * * * *